(12) United States Patent
Holcombe (10) Patent No.: US 12,401,267 B2
(45) Date of Patent: Aug. 26, 2025

(54) ELECTRICAL POWER REGULATING APPARATUS (71) Applicant: Elexsys IP Pty Ltd, Queensland (AU)

(72) Inventor: Bevan Holcombe, Queensland (AU)

(73) Assignee: Elexsys IP Pty Ltd, Queensland (AU)

( * ) Notice: Subject to any disclaimer, the term of this patent is extended or adjusted under 35 U.S.C. 154(b) by 588 days.

(21) Appl. No.: 17/641,411

(22) PCT Filed: Sep. 9, 2020

(86) PCT No.: PCT/AU2020/050951
§ 371 (c)(1),
(2) Date: Mar. 8, 2022

(87) PCT Pub. No.: WO2021/046597
PCT Pub. Date: Mar. 18, 2021

(65) Prior Publication Data
US 2022/0302823 A1 Sep. 22, 2022

(30) Foreign Application Priority Data

Sep. 9, 2019 (AU) .................. 2019903322

(51) Int. Cl.
H02M 1/32 (2007.01)
H02J 3/32 (2006.01)
(Continued)

(52) U.S. Cl.
CPC ............... *H02M 1/322* (2021.05); *H02J 3/32* (2013.01); *H02J 3/381* (2013.01); *H02J 7/345* (2013.01);
(Continued)

(58) Field of Classification Search
CPC ...... H02M 1/322; H02M 1/0085; H02M 1/34; H02M 1/44; H02M 1/123; H02M 1/007;
(Continued)

(56) References Cited

U.S. PATENT DOCUMENTS

| 4,287,465 A | 9/1981 | Godard et al. |
| 4,811,184 A | 3/1989 | Koninsky et al. |

(Continued)

FOREIGN PATENT DOCUMENTS

| AU | 2011201247 A1 | 3/2011 |
| CN | 109167377 A | 1/2019 |

(Continued)

OTHER PUBLICATIONS

International Preliminary Report on Patentability dated Mar. 9, 2022, from related PCT application No. PCT/AU2020/050954, filed on Sep. 9, 2020. 7 pages.

(Continued)

*Primary Examiner* — M Baye Diao
(74) *Attorney, Agent, or Firm* — Fish IP Law, LLP; Tomas A. Prieto (57) ABSTRACT The invention relates to an apparatus for regulating electrical power in an electricity transmission network, the apparatus including: a DC contactor; a transmission network connector including live terminal(s) connected to live connection(s) and a neutral terminal connected to a neutral or earth of the electricity transmission network; switches connected to the DC contactor; electronic controlling devices coupled to the switches and control the switches to independently regulate electrical power on each of the live connection(s) and the neutral connection, the electronic controlling devices receive voltage reading of the live connection(s); calculate average of the voltage reading for the live connection(s); if the average is larger than an upper value, control the switches to reduce voltage on the live connection; if the average is less than a lower value, control the switches to increase voltage supplied on the live connection(s).

20 Claims, 7 Drawing Sheets (51) Int. Cl.
*H02J 3/38* (2006.01)
*H02J 7/34* (2006.01)
*H02M 1/00* (2007.01)
*H02M 1/34* (2007.01)
*H02M 1/44* (2007.01)
*H05K 1/02* (2006.01)

(52) U.S. Cl.
CPC ........... *H02M 1/0085* (2021.05); *H02M 1/34* (2013.01); *H02M 1/44* (2013.01); *H05K 1/0298* (2013.01); *H02J 2207/50* (2020.01)

(58) Field of Classification Search
CPC ...... H02M 1/143; H02M 7/5387; H02M 7/81; H02M 1/0016; H02M 3/33507; H02J 3/32; H02J 3/381; H02J 7/345; H02J 2207/50; H02J 3/1842; H02J 1/08; H02J 3/01; H02J 3/18; H05K 1/0298; H05K 1/0228; H05K 2201/10015; H05K 1/0231; H05K 2201/0792; H05K 2201/09309; Y02E 40/10; Y02E 40/20
USPC ........................................................ 320/166
See application file for complete search history.

(56) References Cited

U.S. PATENT DOCUMENTS

| | | | |
|---|---|---|---|
| 6,040,778 | A | 3/2000 | Hopkins et al. |
| 6,198,611 | B1 | 3/2001 | Macbeth |
| 6,278,279 | B1 | 8/2001 | Daun-Lindberg et al. |
| 6,504,692 | B1 | 1/2003 | Macbeth et al. |
| 6,611,443 | B2 | 8/2003 | Gaudreau |
| 7,161,335 | B2 | 1/2007 | Wei et al. |
| 7,327,588 | B2 | 2/2008 | Ollila |
| 7,834,480 | B2 * | 11/2010 | Mandalakas ......... H02J 3/1842 307/46 |
| 8,085,517 | B2 | 12/2011 | Weems et al. |
| 8,437,883 | B2 | 5/2013 | Powell et al. |
| 8,553,432 | B2 * | 10/2013 | Komulainen ........... H02M 7/49 320/140 |
| 8,577,510 | B2 | 11/2013 | Powell et al. |
| 8,669,669 | B1 * | 3/2014 | Wagoner ................ H02P 9/007 290/44 |
| 9,325,174 | B2 | 4/2016 | Tyler et al. |
| 9,354,641 | B2 | 5/2016 | Peskin et al. |
| 9,450,514 | B2 | 9/2016 | Purhonen et al. |
| 10,884,071 | B2 * | 1/2021 | Butler ................. H02H 1/0015 |
| 11,522,365 | B1 | 12/2022 | Cooper |
| 12,062,910 | B2 * | 8/2024 | Holcombe ........ H02J 13/00002 |
| 2007/0188137 | A1 | 8/2007 | Scheucher |
| 2008/0129307 | A1 | 6/2008 | Yu et al. |
| 2008/0298103 | A1 | 12/2008 | Bendre et al. |
| 2008/0315685 | A1 * | 12/2008 | Mandalakas ......... H02J 3/1842 307/45 |
| 2009/0180226 | A1 | 7/2009 | Rogoll et al. |
| 2009/0244877 | A1 | 10/2009 | Yeh et al. |
| 2011/0210611 | A1 | 9/2011 | Ledenev et al. |
| 2011/0227422 | A1 | 9/2011 | Kumar et al. |
| 2012/0072041 | A1 | 3/2012 | Miller et al. |
| 2012/0081934 | A1 | 4/2012 | Garrity et al. |
| 2012/0174961 | A1 | 7/2012 | Larson et al. |
| 2012/0256483 | A1 | 10/2012 | Nakashima et al. |
| 2013/0207466 | A1 | 8/2013 | Lee et al. |
| 2014/0070617 | A1 | 3/2014 | Detmers et al. |
| 2014/0070756 | A1 | 3/2014 | Kearns et al. |
| 2015/0103574 | A1 | 4/2015 | Hintz |
| 2016/0226254 | A1 | 8/2016 | Cheng et al. |
| 2016/0373044 | A1 | 12/2016 | Chi |
| 2017/0201189 | A1 | 7/2017 | Li et al. |
| 2018/0026550 | A1 | 1/2018 | Dent |
| 2018/0041072 | A1 | 2/2018 | Clifton et al. |
| 2018/0329382 | A1 | 11/2018 | Somani et al. |
| 2018/0331543 | A1 | 11/2018 | Palombini et al. |
| 2019/0252877 | A1 * | 8/2019 | Oresti ............... H02J 13/00034 |
| 2020/0021236 | A1 | 1/2020 | Pan et al. |
| 2020/0274459 | A1 | 8/2020 | Premm et al. |

FOREIGN PATENT DOCUMENTS

| | | |
|---|---|---|
| DE | 102005030907 B4 | 1/2012 |
| EP | 0428377 B1 | 1/1996 |
| EP | 2782204 A1 | 11/2012 |
| EP | 2457313 B1 | 3/2014 |
| EP | 2741388 B1 | 10/2015 |
| JP | 2018110466 A | 8/2019 |
| JP | 2019004673 A | 2/2021 |
| KR | 100703927 B1 | 4/2007 |
| KR | 101849054 B1 | 4/2018 |
| WO | 199944276 A1 | 9/1999 |
| WO | 2010132369 A1 | 11/2010 |
| WO | 2012100263 A2 | 7/2012 |
| WO | 2014078904 A1 | 5/2014 |
| WO | 2016007565 A1 | 1/2016 |
| WO | 2017161059 A1 | 9/2017 |
| WO | 2018179715 A1 | 10/2018 |
| WO | 2020163911 A1 | 8/2020 |
| WO | 2020163912 A1 | 8/2020 |
| WO | 2021046597 A1 | 3/2021 |
| WO | 2021046600 A1 | 3/2021 |

OTHER PUBLICATIONS

International Preliminary Report on Patentability for International Application No. PCT/AU2020/050116, dated Aug. 26, 2021, 6 pages.

International Preliminary Report on Patentability for International Application No. PCT/AU2020/050117, dated Aug. 26, 2021, 6 pages.

Aman et al., "Optimal Placement and Sizing of a DG Based on a New Power Stability Index and Line Losses," Electrical Power and Energy Systems, May 26, 2012, pp. 1296-1304, vol. 43.

Li et al., "A Review of the Single Phase Photovoltaic Module Integrated Converter Topologies With Three Different DC Link Configurations," IEEE Transactions on Power Electronics, May 2008, pp. 1320-1333, vol. 23, No. 3.

Ooi et al., "Mid-Point Siting of FACTS Devices in Transmission Lines," IEEE Transactions on Power Delivery, Oct. 1997, pp. 1717-1722, vol. 12, No. 4.

Wolfs et al., "Improvements to LV Distribution System PV Penetration Limits using a dSTATCOM with Reduced DC Bus Capacitance," IEEE Power and Energy Society General Meeting (PES), 2013.

* cited by examiner

ELECTRICAL POWER REGULATING APPARATUS

BACKGROUND OF THE INVENTION

The present invention relates to an electrical power regulating apparatus, and in one particular example, an electrical power regulating apparatus for regulating power in an electrical transmission or distribution network.

DESCRIPTION OF THE PRIOR ART

In a power transmission or distribution system, a power regulating device is implemented to regulate the supply of power over a wide range of load conditions. Currently, a static synchronous compensator (STATCOM) is typically used as a regulating device in alternating current (AC) transmission networks. A STATCOM for a distribution network are often referred to as dSTATCOM which uses electronic switching of energy storage banks to stabilise network supplied voltages.

More recently, dSTATCOM devices are used to regulate power in three-phase electrical distribution networks. However, current three-phase dSTATCOM devices can only operate in a balanced-phased mode, in which all three phases are regulated together. This limitation restricts the efficacy, performance and functionality of the dSTATCOM.

The reference in this specification to any prior publication (or information derived from it), or to any matter which is known, is not, and should not be taken as an acknowledgment or admission or any form of suggestion that the prior publication (or information derived from it) or known matter forms part of the common general knowledge in the field of endeavour to which this specification relates.

SUMMARY OF THE PRESENT INVENTION

In one broad form an aspect of the present invention seeks to provide an electrical power regulating apparatus configured to regulate electrical power in an electricity transmission network, the apparatus including: a DC contactor having DC terminals configured to be connected to a DC device; a transmission network connector configured to be connected to the electricity transmission network and including: at least one live terminal configured to be connected to the electricity transmission network; and a neutral terminal configured to be connected to at least one of a neutral or earth of the electricity transmission network; a plurality of switches connected to the DC contactor; at least one live connection connected to the switches and a respective live terminal; a neutral connection connected to the switches and the neutral terminal; a one or more filters configured to suppress noise on the at least one connection; and one or more electronic controlling devices coupled to the switches and being configured to control the switches to selectively connect the DC terminals and the at least one live connection and the neutral connection to thereby independently regulate electrical power on each of the at least one live connection and the neutral connection.

In one embodiment the one or more electronics controlling devices are configured to control the switches to operate in a current mode or a voltage mode.

In one embodiment the one or more electronics controlling devices are configured to control the switches to change between operating in a current mode and a voltage mode.

In one embodiment, when in the current mode, the one or more electronics controlling devices are configured to control the switches so that each of the least one of the live terminals or the DC terminals have a predetermined current waveform.

In one embodiment, when in the voltage mode, the one or more electronics controlling devices are configured to control the switches so that each of the least one live terminals or the DC terminals have a predetermined voltage waveform.

In one embodiment, wherein the apparatus further includes a snubber circuit connected between the one or more filters and the DC contactor for suppressing noise.

In one embodiment the neutral connection is decoupled from an earth.

In one embodiment the switches include a plurality of silicon carbide MOSFET switches.

In one embodiment the switches include a plurality of symmetrical half-bridge topology arms connecting to the at least one live connection and the neutral connection.

In one embodiment the one or more filters include at least one of: an electromagnetic interference (EMI) choke; a differential-mode choke connected to the at least one live connection and the neutral connection for filtering noise; and a common-mode choke connected to the switches for suppressing interference.

In one embodiment the switches have a plurality of capacitors configured to at least one of: smooth fluctuations in DC power; and store enough energy to complete each switching cycle with a full-phase offset range.

In one embodiment the plurality of capacitors are connected to a failsafe mechanism to discharge the capacitors in the event of a fault.

In one embodiment the capacitors are connected through an interleaving structure with a multi-layer printed circuit board (PCB).

In one embodiment the interleaving structure includes one or more through-holes connecting a positive contact of one of the capacitors to one or more positive layers of the PCB and a negative contact of one of the capacitor to one or more negative layers of the PCB.

In one embodiment the multi-layer PCB defines alternating polarity layers to cancel generated magnetic fields.

In one embodiment the multi-layer PCB includes eight electrically conductive layers.

In one embodiment the multi-layer PCB has at least two outer electrically conductive layers being negative layers.

In one embodiment the failsafe mechanism includes at least one of: a hardware failsafe mechanism being configured to disconnect the DC contactor or the transmission network connector in the event of a fault; and a software failsafe mechanism, in the event of a fault, being configured to at least one of: rapidly connect and disconnect the capacitors to earth; and turn off the DC contactor or the transmission network connector.

In one embodiment the one or more electronic controlling devices include a master controller and a slave controller.

In one embodiment the DC device includes at least one of: a battery; a solar power generator; a hydrokinetic power generator; and a wind power generator.

In one embodiment the transmission network connector includes at least one of: an AC contactor; an AC relay; and an AC circuit breaker for each of the at least one live terminal.

In one embodiment the apparatus further includes a load connector configured to be connected to a load and including: at least one load terminal configured to be connected to the load; and a load neutral terminal configured to be connected to at least one of a neutral or earth of the load.

In one embodiment the load connector includes a DC circuit breaker for each of the at least one load terminal.

In one embodiment the apparatus further includes a communication interface connected to the one or more electronic controlling devices for communicating with an external device.

It will be appreciated that the broad forms of the invention and their respective features can be used in conjunction and/or independently, and reference to separate broad forms is not intended to be limiting. Furthermore, it will be appreciated that features of the method can be performed using the system or apparatus and that features of the system or apparatus can be implemented using the method.

BRIEF DESCRIPTION OF THE DRAWINGS

Various examples and embodiments of the present invention will now be described with reference to the accompanying drawings, in which:—

DETAILED DESCRIPTION OF THE PREFERRED EMBODIMENTS

Figure 1:
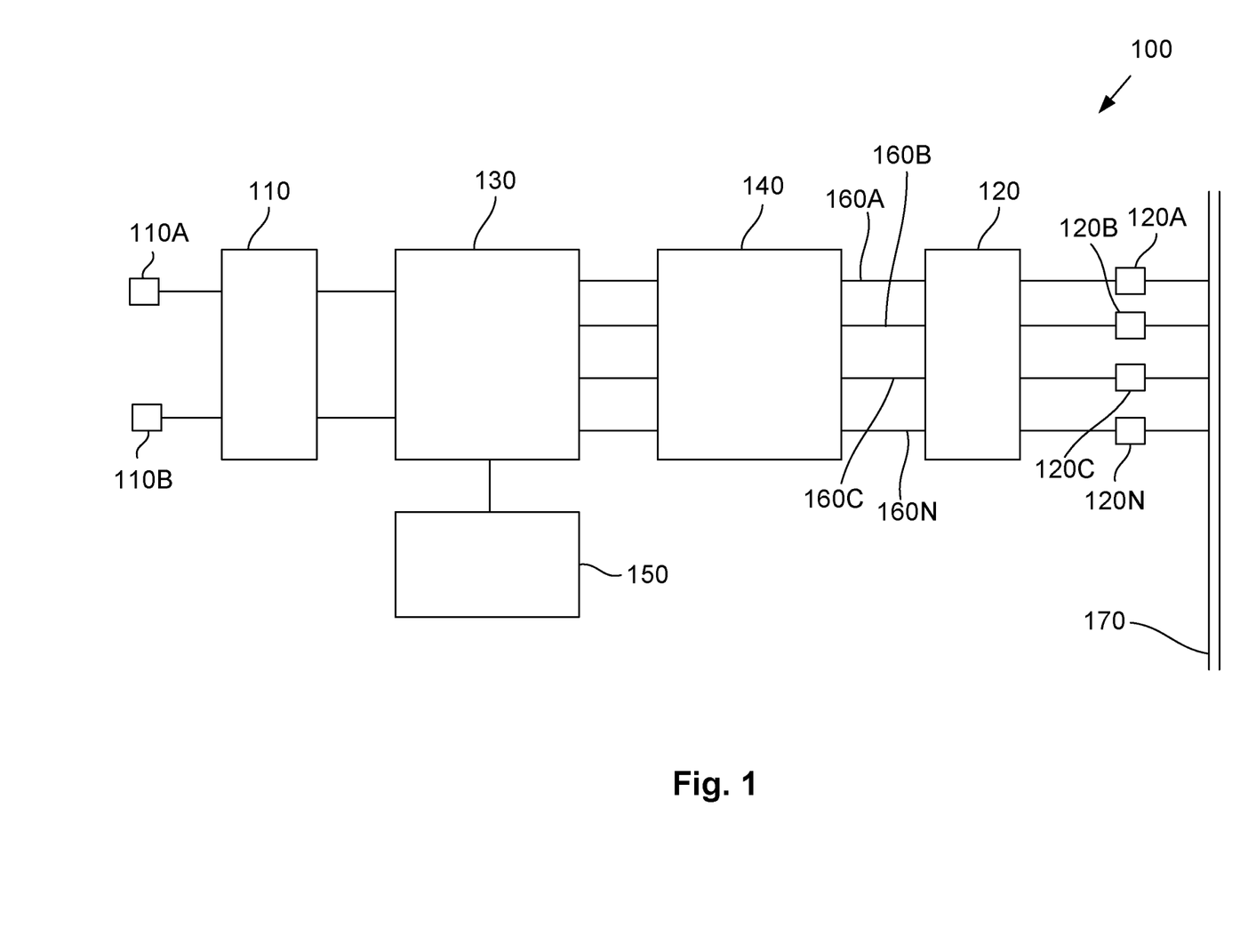
FIG. 1 is a schematic diagram of an example of an electrical power regulating apparatus.

An example of an electrical power regulating apparatus will now be described with reference to FIG. 1.

An electrical power regulating apparatus 100 configured to regulate electrical power in an electricity transmission network. The electrical power regulating apparatus 100 includes a DC contactor 110, a transmission network connector 120, a plurality of switches 130, a one or more filters 140, one or more electronic controlling devices 150, at least one live connection 160A, 160B, 160C, and a neutral connection 160N.

The DC contactor 110 having DC terminals 110A, 110B is configured to connect to a DC device (not shown). The DC device may be DC power supply, such as at least one of a battery, a solar power generator; a hydrokinetic power generator, a wind power generator, or the like.

The transmission network connector 120 is configured to be connected to the electricity transmission network, in this example, via a transmission bus 170. The transmission network connector 120 includes at least one live terminal 120A, 120B, 120C, and the live terminals 120A, 120B, 120C are configured to be connected to the electricity transmission network. The transmission network connector 120 further includes a neutral terminal 120N being configured to be connected to at least one of a neutral or earth of the electricity transmission network.

One or more filters 140 are provided that are configured to suppress noise on the at least one connection 160A, 160B, 160C. In this example, the transmission network connector 120 is coupled to the one or more filters 140 with at least one live connection 160A, 160B, 160C and a neutral connection 160N. The live connections 160A, 160B, 160C are connected their respective live terminal 120A, 120B, 120C, and the neutral connection 160N is connected to the neutral terminal 120N. However, it will be appreciated that other suitable configuration could be used.

The plurality of switches 130 is connected to the DC contactor and provide onward connectivity to the transmission network connector, in this example by being connected to the one or more filters 140, and specifically with the least one live connections 160A, 160B, 160C and a neutral connection 160N.

The switches 130 are further coupled with the one or more electronic controlling devices 150. The one or more electronic controlling devices 150 are configured to control the switches 130 to selectively connect the DC terminals 110A, 110B and the at least one live connection 160A, 160B, 160C and the neutral connection 160N to thereby independently regulate electrical power on each of the at least one live connection 160A, 160B, 160C and the neutral connection 160N.

Accordingly, the one or more controlling devices 150 may be formed from any suitable controlling device that is capable of controlling the switches 130, and could include a microprocessor, microchip processor, logic gate configuration, firmware optionally associated with implementing logic such as an FPGA (Field Programmable Gate Array), or any other electronic device, system or arrangement. Furthermore, for ease of illustration the remaining description will refer to an electronic controlling device, but it will be appreciated that multiple controlling devices could be used, with controlling distributed between the devices as needed, and that reference to the singular encompasses the plural arrangement and vice versa.

Figure 2:
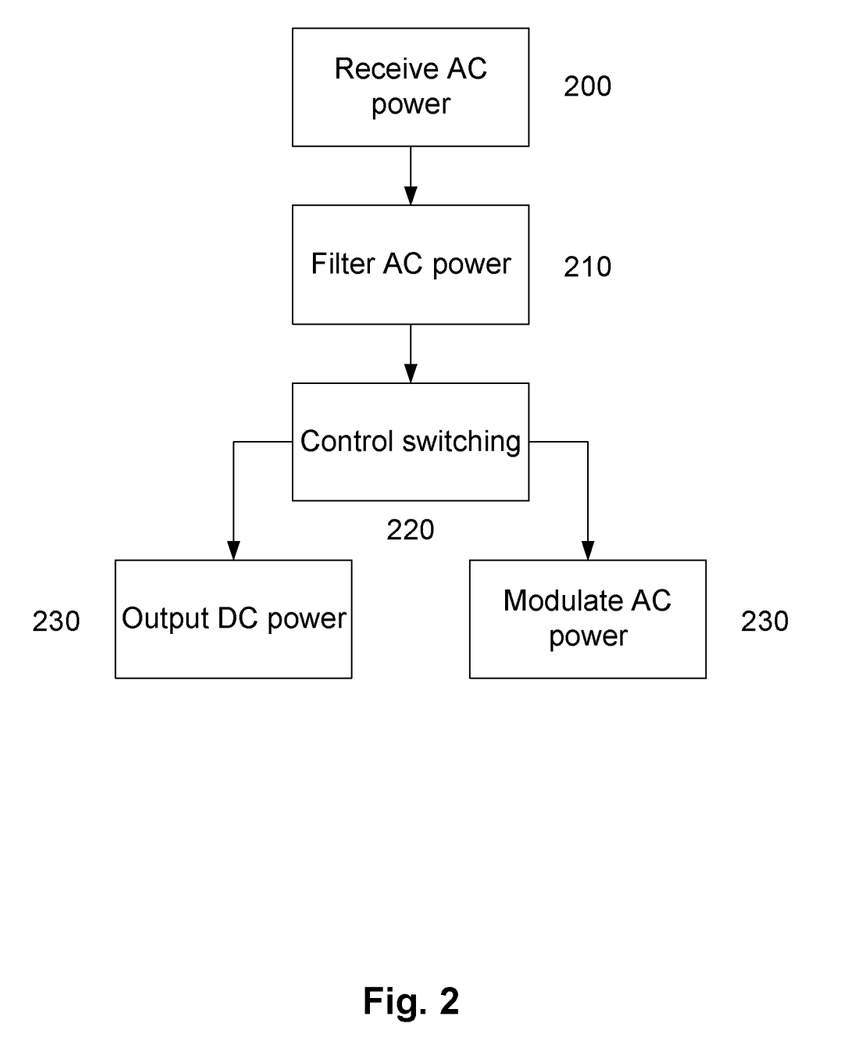
FIG. 2 is a flow chart of an example of an operation of an electrical power regulating apparatus.

An example of operation of the electrical power regulating apparatus 100 will now be described with reference to FIG. 2.

In this example, the electrical power regulating apparatus 100 connects to the electricity transmission network. At step 200, the one or more live terminals 120A, 120B, 120C of the electrical power regulating apparatus 100 receives electrical power from the electricity transmission network, and the neutral terminal 120N is connected to the neutral or earth of the electricity transmission network. In one example, each of the one or more live terminals 120A, 120B, 120C receives a respective phase of the electrical power from the electricity transmission network.

The live connections 160A, 160B, 160C are connected to the respective live terminals 120A, 120B, 120C to carry a respective phase of the AC power. At step 210, the AC power carried on the live connections 160A, 160B, 160 and the neutral connection 160N are passed through to the one or more filters 140 for filtering noise and/or interference of the AC power.

The filtered AC power is passed to the switches 130 with the one or more live connection 160A, 160B, 160C and the neutral connection 160N. At step 220, the electronic controlling device 150 controls the switches 130 of the one or more live connection 160A, 160B, 160C and the neutral connection 160N. The switches 130 are controlled to selectively connect the DC terminals 110A, 110B and the at least one live connection 160A, 160B, 160C and the neutral connection 160N, so that electrical power on each of the one or more live connection 160A, 160B, 160C and the neutral connection 160N are independently regulated. This allows DC power to be output to the DC terminals 110A, 110B at step 230, for example to charge a battery.

Alternatively, this allows DC power supplied to the DC terminals from the DC device to be used to modulate power on the live connection 160A, 160B, 160C and the neutral connection 160N at step 240. For example, the electrical power regulating apparatus 100 can independently regulates the electrical power characteristics on each of the one or more live connections 160A, 160B, 160C and the neutral connection 160N, for example by adjusting a phase angle, magnitude or condition of the voltages or current on the connections, which can in turn be used to accommodate unbalanced voltage or current input on each of the live connections and allows adjustment of the voltage and/or current on each of the live connections thereby conditions and/or regulates the power. As the electrical power regulating apparatus 100 is able to independently regulate the electrical power on each of the one or more live connections 160A, 160B, 160C and the neutral connection 160N, this allows the electrical power regulating apparatus 100 to operate with an unbalanced load or as an unbalanced supply. This also allows the electrical power regulating apparatus 100 to be implemented in any one of a three-phase, two-phase and a single-phase system, and operates to regulate voltage and/or current of the system.

It should be appreciated that the electrical power regulating apparatus 100 herein described regulates for AC-to-DC power system is for exemplary only. The electrical regulating apparatus 100 is capable of regulating DC-to-AC power systems, AC-to-AC power systems or DC-to-DC power systems.

A number of further features will now be described.

The electronics controlling device is configured to control the switches to operate in a current mode or a voltage mode. Additionally, the electronics controlling device is configured to control the switches to change between operating in a current mode and a voltage mode. This allows the electrical power regulating apparats to provide a suitable voltage or current to meet an output requirement and transitions between the modes when the requirement changes.

Accordingly, when in the current mode, the electronics controlling device is configured to control the switches so that each of the least one live terminals or the DC terminals have a predetermined current waveform. Similarly, when in the voltage mode, the electronics controlling device is configured to control the switches so that each of the least one live terminals or the DC terminals have a predetermined voltage waveform. This allows the electrical power regulating apparats to provide voltage or current waveforms that meets the requirements of the DC device or the electricity transmission network.

The electrical power regulating apparatus may further include a snubber circuit connected between the one or more filters and the DC contactor for suppressing noise.

In one example, the neutral connection is decoupled from an earth, such as an earth of the electricity transmission network, which can be achieve using one or more capacitors, or the like. This allows the neutral connection to be regulated or modulated, which in turn provides greater flexibility in terms of the overall control the system can provide.

The switches may be a plurality of symmetrical half-bridge topology arms that connect to the at least one live connection and the neutral connection, which allows selectable switching of the live connections and the neutral connection. Additionally, the switches may be silicon carbide MOSFET switches, which is advantageously allows the switches to be physically compact.

In one example, the one or more filters may be at least one of: an electromagnetic interference (EMI) choke; a differential-mode choke connected to the at least one live connection and the neutral connection for filtering noise; and a common-mode choke connected to the switches for suppressing interference. The one or more filters advantageously eliminate the noise or interference from the electricity transmission network or the switches.

The switches may have a plurality of capacitors configured to store ample energy to complete each switching cycle with a full-phase offset range and hence smooth fluctuations in DC power, so that it facilitates in protecting the DC devices by providing DC power with minimal fluctuations. The capacitors may be any one of film capacitors, ceramic capacitors and electrolytic capacitors. It should be appreciated that other types of capacitors can also suitable.

The plurality of capacitors may be connected through an interleaving structure with a multi-layer PCB to further minimise noise caused by the PCB tracks. In one example, the interleaving structure includes one or more through-holes connecting a positive contact of one of the capacitors to one or more positive layers of the PCB and a negative contact of one of the capacitor to one or more negative layers of the PCB. Additionally, the multi-layer PCB may define alternating polarity layers so as to cancel magnetic fields generated by each layer of PCB. In one example, the multi-layer PCB including eight electrically conductive layers having electrically conductive negative layers, wherein two of the negative layers are outer layers and alternating polarities in between layers.

In one example, the plurality of capacitors may be further connected to a failsafe mechanism to discharge the capacitors in the event of a fault. The fault can be over-current, voltage overshoot, loss of power, controlling device failure and/or communication failure.

The failsafe mechanism may be a hardware failsafe mechanism and/or a software failsafe mechanism. In this example, the hardware failsafe mechanism is configured to disconnect the DC contactor or the transmission network connector in the event of the fault, whereas the software failsafe mechanism is configured to rapidly connect and disconnect the capacitors to earth and/or turn off the DC contactor or the transmission network connector. The failsafe mechanism provides protection to the electronics of the apparatus, such as the MOSFET switches, microcontrollers, from being damaged by over-current or voltage overshoot.

The electronic controlling device may include a master controller and a slave controller.

The transmission network connector may include at least one of an AC contactor; an AC relay; and an AC circuit breaker for each of the at least one live terminal.

Additionally the electrical power regulating apparatus may include a load connector for connecting to a load. The load connector may include at least one load terminal connected to the load and a load neutral terminal connected to at least one of a neutral or earth of the load. Similarly, the load connector may include a DC circuit breaker for each of the at least one load terminal.

The electrical power regulating apparatus may further include a communication interface connected to the electronic controlling device for communicating with an external device. The communication interface may be WAN, Bluetooth, WLAN and/or suitable serial ports to allow the electrical power regulating apparatus to be controlled or configured by an external computer.

Figure 3:
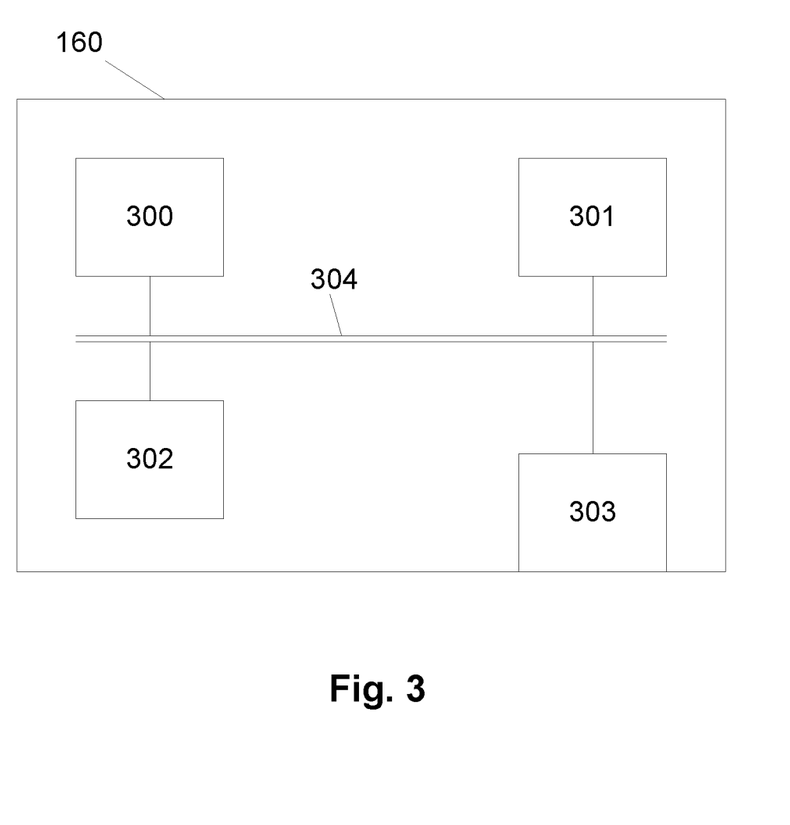
FIG. 3 is a schematic diagram of an example of a processing system.

An example of an electronic controlling device will now be described with reference to FIG. 3.

In this example, the electronic controlling device 160 includes at least one microprocessor 300, a memory 301, an optional input/output device 302, such as a keyboard and/or display, an interface 303, interconnected via a bus 304 as shown. In this example the interface 303 can be utilised for connecting the electronic controlling device 160 to peripheral devices, such as communications networks, or the like.

In use, the microprocessor 300 executes instructions in the form of applications software stored in the memory 301 to allow the required processes to be performed, including controlling the electronic controlling device 160. The applications software may include one or more software modules, and may be executed in a suitable execution environment, such as an operating system environment, or the like.

Accordingly, it will be appreciated that the electronic controlling device 160 may be formed from any suitable control system and could include be any electronic processing device such as a microprocessor, microchip processor, logic gate configuration, firmware optionally associated with implementing logic such as an FPGA (Field Programmable Gate Array), or any other electronic device, system or arrangement.

However, it will be appreciated that the above described configuration assumed for the purpose of the following examples is not essential, and numerous other configurations may be used. It will also be appreciated that the partitioning of functionality between the different processing systems may vary, depending on the particular implementation.

Figure 4:
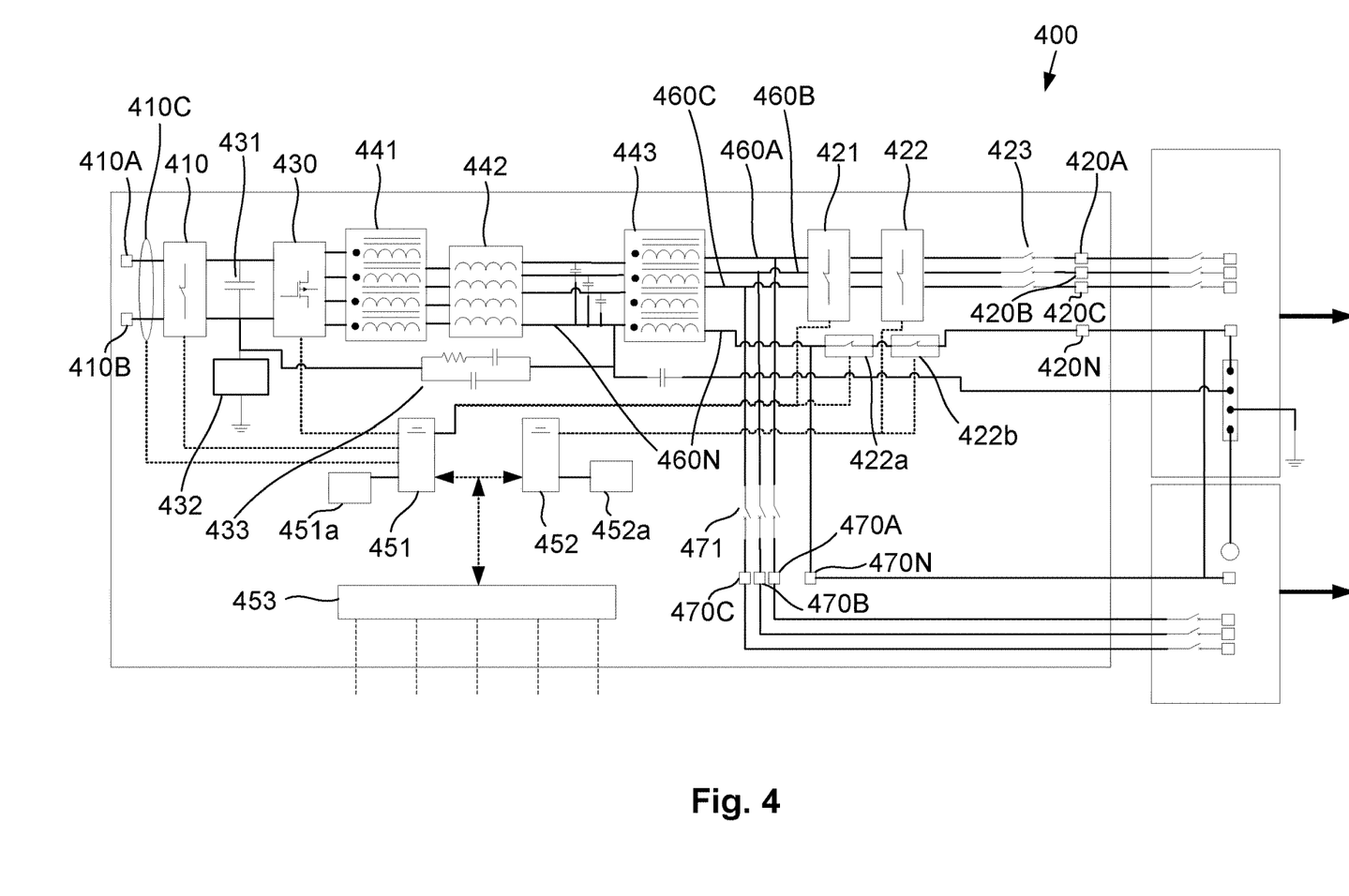
FIG. 4 is a schematic diagram of an example of an electrical power regulating apparatus.

An example of the electrical power regulating apparatus will now be described in more detail with reference to FIG. 4.

An electrical power regulating apparatus 400 configured to regulate electrical power in an electricity transmission network. The electrical power regulating apparatus 400 includes one or more DC contactors 410, a plurality of capacitors 431, a plurality of switches 430, a common-mode (CM) choke 441, one or more differential-mode (DM) chokes 442, an EMI choke 443, a grid connector, and a load connector. The grid connector includes an AC connector 421, an AC relay 422, AC circuit breakers 423, and three AC terminals 420A, 420B, 420C and an AC neutral connector 420N. The load connector includes load circuit breakers 471 and three load terminals 470A, 470B, 470C and the load neutral connector 470N. The electrical power regulating apparatus 400 also includes three connections 460A, 460B, 460C, and a neutral connection 460N. The three connections 460A, 460B, 460C are connected to the respective live connection with the AC terminals 420A, 420B, 420C. The neutral connection is connected to the respective grid/live side neutral connection. Connections made post an electrical power regulating apparatus are connected in accordance with local rules, regulations and standards.

The DC contactor 410 having DC terminals 410A, 410B. The DC terminals 410A, 410B are configured to connect to a battery and a low voltage (LV) solar power generator. In this example, the DC contactor 410 includes at least one mechanical switch for switching both terminals 410A, 410B. Mechanical switches are robust and reliable, and can be configured to have a high breaking capabilities in voltage and current to improve electrical safety.

In one embodiment, a safety interlocking mechanism is implemented. The safety interlocking mechanism may include interlocking multiple AC contactors and/or interlocking both the AC and DC contactors. The safety interlocking mechanism may utilizes an on-board processor, such as one of the controlling devices 451, 452, and a supplementary external processor to switch on the supply. The on-board processor monitors the status of the electrical power regulating apparatus 400 while the external processor monitoring at safety considerations, such as battery voltage and/or battery polarity. Both processors crosscheck each other before operating the contactor.

A DC bus sensor 410C is implemented to monitor the current at the DC terminals 410A, 410B. The DC bus sensor 410C is coupled to the controlling device 451 and allows leakage current or residual current to be detected. In an example, a Sigma-Delta configuration is used for the DC bus sensor 410C, which provides high voltage isolation and accuracy in sensing.

DC Capacitors

The DC contactor 410 is connected to the switches 430 via the capacitors 431. In this example, the capacitors 431 are polypropylene capacitors. The polypropylene capacitors are capable of operating with relatively high ripple currents, which allows the users to control higher order harmonics without decreasing capacitor life. Polypropylene capacitor also have self-healing capabilities, which allows the size of the capacitors to be reduced for providing a required capacitance and accommodating transient voltage.

Figure 5A:
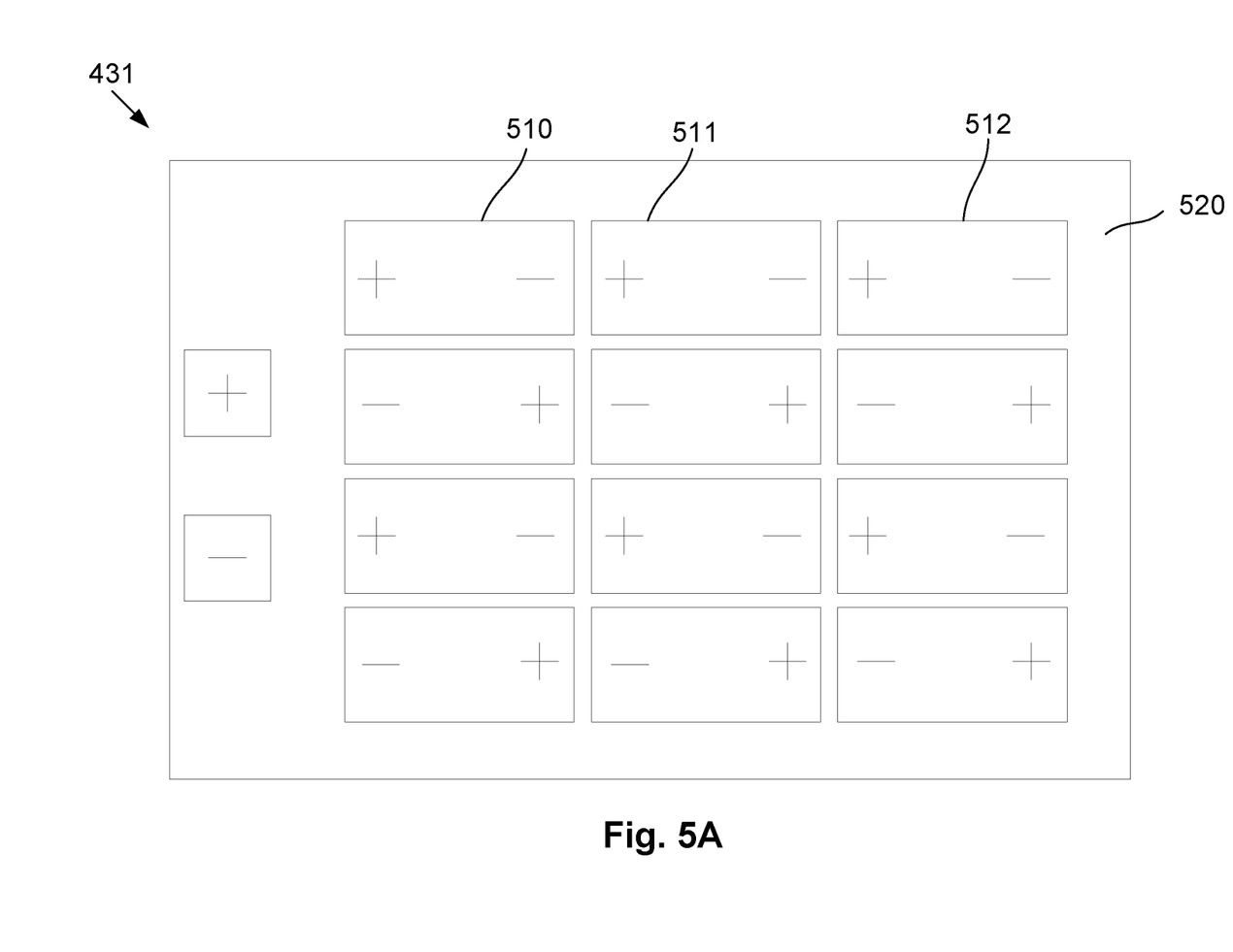
FIGS. 5A and 5B are schematic diagrams of capacitors on a printed circuit board of an electrical power regulating apparatus.

In this example, there are twelve capacitors in the electrical power regulating apparatus 400. The capacitors are mounted on a multi-layer printed circuit board (PCB) in a three-by-four array arrangement. The tracks connecting the capacitors are on the multi-layer PCB with an interleaving structure to minimise parasitic inductance. The interleaving structure is described in more detail with reference to FIGS. 5A and 5B. As illustrated in FIG. 5A, the twelve capacitors are placed on the board 520 in an alternating polarity manner. Accordingly, a positive contact of a capacitor 511 is positioned adjacent to a negative contact of a capacitor 512. Furthermore, the board 520 has eight layers and each layer is plated with copper which makes the layer conductible, thereby minimising the 'trace' inductance effect. The layers are connected to either the positive or the negative of the capacitor contacts, which makes an alternating polarity pattern of the layers.

Figure 5B:
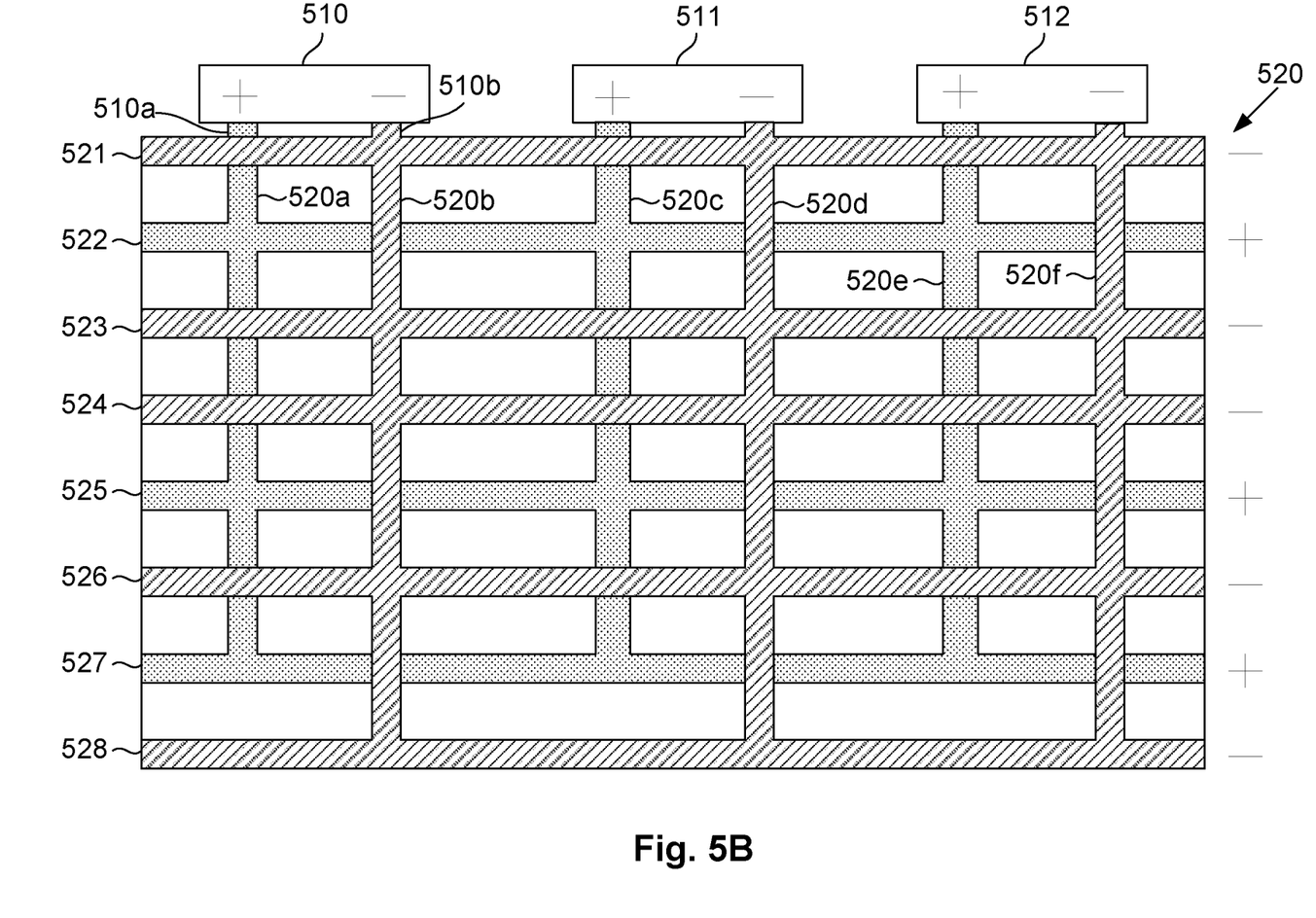

Referring to FIG. 5B, the capacitor 510 has a positive contact 510a and a negative contact 510b. The positive contact 510b is in contact with the second layer 522, the fifth layer 525 and the seventh layer 527 by a through-hole (also called 'via') structure 520a of the board 520. The negative contact 510b is soldered on the first layer 521, whilst in contact with other layers 523, 524, 526 and 528 with a through-hole structure 520b. Similarly, capacitors 511, 512 are connected to the board 520 with through-hole structures 520c, 520d and 520e, 520f as illustrated in FIG. 5B. In one example, the interleaved structure uses eight layers with approximately 2 oz copper per layer, and the layers are separated with FR4 PCB material with a thickness of approximately 0.4 mm. It should be appreciated that other suitable materials and/or thickness may be used depending on different system requirement.

The interleaving structure allows the parasitic inductance to be reduced as the current is distributed across multiple layers. There are also no 'tracks' on the layers which induces inductance. The parallel layers with alternating polarity may increase the parasitic capacitance to complement the capacitors. As described, there is an alternating plate pattern between positive and negative, thereby minimising parasitic inductance and increasing total capacitance. This also improves the equivalent series resistance (ESR) and temperatures as there is less eddy current circulation (phenomenon where induced currents from magnetic fields interact with traces/wires). With a more stable temperature the change in capacitance due to temperature during operation is reduced.

In this example, the top layer 521 and bottom layer 528 are negative, so that the board 520 has a minimal electromagnetic interference (EMI) and therefore an improvement in the electromagnetic compatibility (EMC). The interleaving structure also reduces EMI currents that are induced within the board 520, and thereby reducing overall magnitude of noise within the board 520.

The electrical power regulating apparatus 400 also includes a failsafe system 433 coupling the capacitors 432 to earth and controls the discharging of the capacitors in the event of a fault. The failsafe system 433 includes a software failsafe and a hardware failsafe mechanism. When a voltage abnormality is detected, the software failsafe mechanism switches the capacitors on and off rapidly to safely discharge the capacitors. Moreover, if power is lost, the hardware failsafe mechanism opens the DC and AC contactors. The hardware failsafe mechanism also includes an external DC battery fuse and an external AC grid fuse.

Switches

Figure 6:
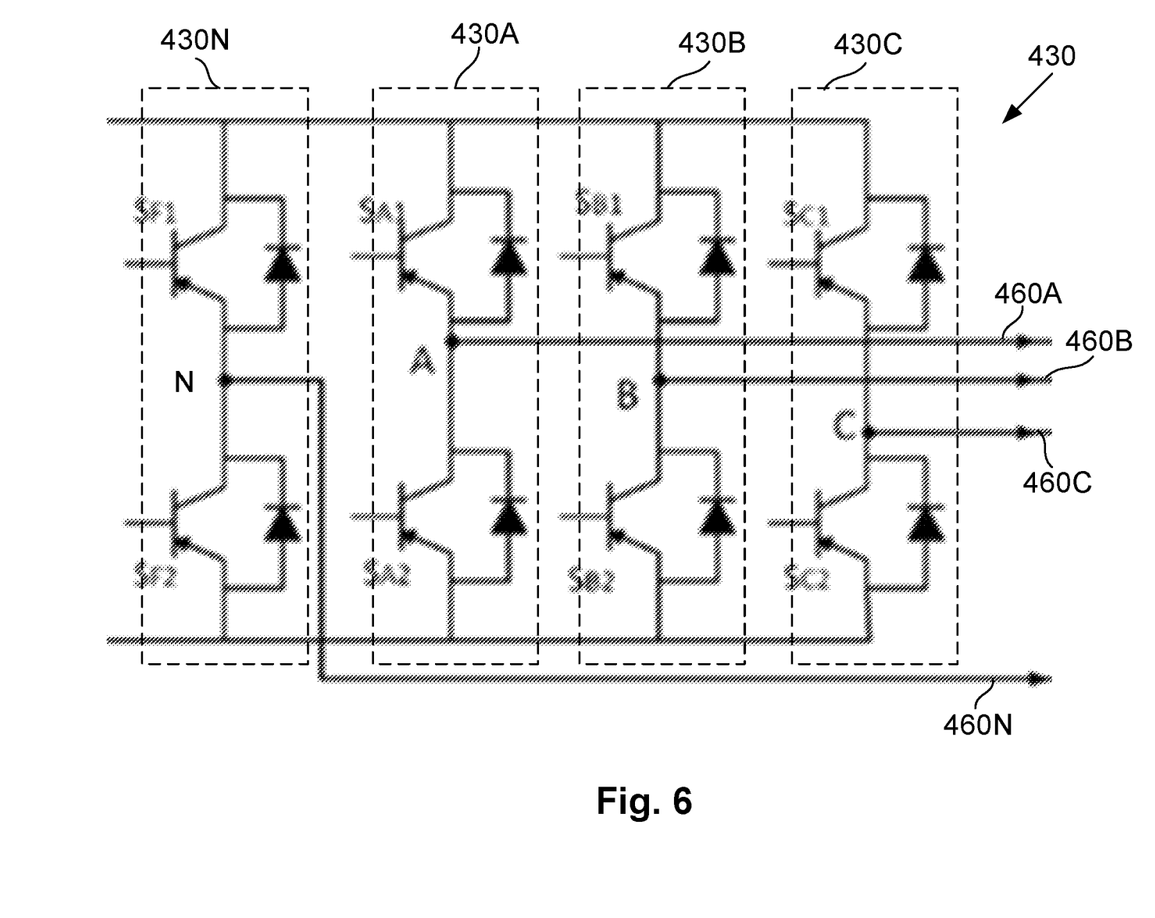
FIG. 6 is a schematic diagram of an example of switches of an electrical power regulating apparatus.

The capacitors 431 are connected to the switches 430 for modulating the each of the three connections 460A, 460B, 460C, and the neutral connection 460N. FIG. 6 shows an example of the switches 430, which includes four symmetrical half bridge topology arms 430A, 430B, 430C, 430N connecting to each of the three connections 460A, 460B, 460C and the neutral connection 460N. Each symmetrical half bridge topology arms includes two MOSFET switches. In this example, the MOSFET switches are silicon carbide switches, particularly, 1200V 55 A SCT3040 MOSFET in compliant with the ROHM standard.

The switching characteristics, such as rise time, fall time, and dead-time, of the switches 430 can be configured by hardware design and/or the controlling devices 451, 452 to optimise the performance. The switches 430 can operate in higher switching frequencies (approximately 100 kHz) due to a reduction of the primary side to secondary side capacitance as the specific isolation devices are used. This also allows high voltage isolation barrier to increase noise immunity and provide high voltage protection between primary side and secondary side. The switches 430 may further include a snubber circuit 433 to reduce the voltage changes over time (dv/dt) to meet the EMI/EMC requirements.

CM Choke

The CM choke 441 is coupled to the switches 430 to suppress and/or reject high frequency common mode current. The live connections 460A, 460B, 460C and the neutral connection 460N are connected to the CM choke 441 and passed through a core. The core of the CM choke 441 may be a powder core and can be configured to operate in high frequency with low loss. The CM choke 441 is also configured to operate in wider temperature range condition while maintaining low energy losses. Furthermore, in one example, the CM choke 441 may be insulated from an outer chassis of the electrical power regulating apparatus 400, so that high frequency magnetic coupling to the surrounding equipment is minimised. The windings of the CM choke 441 may be of a non-interleaved structure, thereby reducing coupling noise propagating to adjacent conductors. Additionally, the winding may be copper flat bar winding, which minimises copper losses in low and high frequencies. Flat bar winding may also reduce skin effect when compared to round windings. The increased surface area of the flat bar winding may help with heat dissipation of the CM choke 441.

DM Choke

The CM choke 441 is coupled to a DM choke 442, which acts like a bandpass filter and smooths high frequency from the PWM generated by the switches 430. The DM choke 442 may include individual differential mode inductors that are built of EE cores. The EE cores are compact and easier to manufacture when compared to toroidal cores. The EE core may also shields from high frequency noise and stray magnetic fields. Additionally, the core of the DM choke 442 may be made of a high saturation-point powder core material, so that the DM choke 442 can be configured to operate in high frequency with low loss. This allows the DM choke to have a consistent filter performance, and the inductor to have an overrated capacity a short term. The DM choke 441 can be configured to operate in wider temperature range condition while maintaining low energy losses. Furthermore, the DM choke 442 may be insulated from an outer chassis of the electrical power regulating apparatus 400, so that high frequency magnetic coupling to the surrounding equipment is minimised.

The winding of the DM choke 442 includes copper film winding, which may be thin and flat copper film, to minimise copper loss in low and high frequencies. Copper film winding may also reduce skin effect when compared to round windings. The increased surface area of the film winding may help with heat dissipation of the DM choke 442. The use of film winding also allows an increase in the number of turns without compromising in size and/or skin effect losses.

EMI Filter

The DM choke 442 is coupled to an EMI filter 443, which filters out high frequency electromagnetic interference. This may help preventing any stray common mode current from exporting to the grid, any common mode current from grid impacting the control circuitry. The EMI filter 443 includes a ring core with nano-crystalline material. Solid enamelled copper wire may be used around core material to minimise copper losses, particularly at 50 Hz. The EMI filter 443 includes symmetrical windings to minimise leakage inductance. The EMI filter 443 may also include Y capacitors (Y2 rated) in its PCB design.

It should be appreciated that current and/or voltage measurements may be implemented at any point in the electrical power regulating apparatus 400. In one example, the AC current and voltage measurements are implemented between the DM choke 442 and the EMI choke 443. The AC current may be measured with a LEM (100–p) 100 A high precision hall-effect sensor.

The electrical power regulating apparatus 400 includes Class X capacitors (X2 rated) between the DM choke 442 and the EMI choke 443. The X capacitors can be useful for high voltage applications to minimise high voltage transients. This also allows shielding signal traces from power traces on the PCB and also provide protection from primary side to secondary side. As illustrated in FIG. 4, an earth link is provided at this point for the neutral connection 460N through a decoupling capacitor.

Load Contactor

In this example, the electrical power regulating apparatus 400 includes the load connector, so that the electrical power regulating apparatus 400 can provide UPS functionality while connected to the grid. The load connector has a 63A circuit breaker 471 for each live connection 460A, 460B, 460C. The connectors may be Amphenol connectors. As the electrical power regulating apparatus 400 is able to compensate the harmonic components to match the load component, this allows the harmonic content to be managed and not passed through to the grid. This also provides the load with a "clean" AC source. The electrical power regulating apparatus 400 can operate with an unbalanced load condition as the neutral connection 460N can be modulated.

This allows the electrical power regulating apparatus 400 to be a source to the load regardless to whether the load is a three-phase, two-phase or a single-phase load. This is particularly useful for off grid loads with large induction machines, such as farming equipment, conveyor belts, fridges etc.

AC Contactor

The AC contactor 421 is coupled to the EMI filter 443 for connecting to the grid. The AC contactor 421 may be a Semmens three-phase (AC-3 rated) contactor with 38 kW breaking capacity which has low power consumption, such as less than 4 W. The AC contactor 421 is also robust, reliability and able to break high fault currents while providing short switch on and off response times. The AC contactor 421 may include internal sensors in communications with at least one of the controlling devices 451, 452, so that the AC contactor operational status is monitored and controlled.

AC Relay

An AC relay 422, 422a, 422b are coupled between the AC contact 421 and the grid to provide an additional isolation. As illustrated in FIG. 4, the neutral connection 460N are separately coupled to two AC relay 422a, 422b. The AC relay 422, 422a, 422b are in communication with at least one of the controlling devices 451, 452. Additionally, the AC contactor 421 and the AC relay 422 are controlled by different controlling devices 451, 452. This allows the AC contactor 421 and the AC relay 422 to perform interlocking which provide additional safety. Similarly, the two AC relay 422a, 422b are also controlled by different controlling devices 451, 452 to provide additional safety to the neutral connection 460N.

Circuit Breaker

Similar to the load connection circuit breakers 471, circuit breakers 423 are coupled to each of the live connections to form the isolation barrier between the AC terminals 420A, 420B, 420C and the AC contactor 421. This provides additional overcurrent protection to the electrical power regulating apparatus 400. The circuit breakers 423 are rated at 63A to allow operations in various temperatures and no prematurely breakage due to temperature.

MCU

The controlling devices 451, 452 may be two on-board microprocessors. A first microprocessor 451 includes executable programs to control the operation of the apparatus 400, and a second microprocessor 452 is functioned as a safety interlocking controller. An analogue measurement 451a and a temperature measurement 452a may be coupled to the microprocessors 451, 452 respectively. Furthermore, a communication interface 453 is also connected to the microprocessors 451, 452. The communication interface 453 may include one or more interface for Modbus (TCP/IP), USB, RS232/485, Ethernet, demand response mode (DRM) communications. This allows external processors to communicate with the apparatus 400 for monitoring, controlling and/or configuration the apparatus 400.

The electrical power regulating apparatus provides at least the following advantages:

Fast response, often under 20 milliseconds
Continuous control of voltage
Addresses flicker issues
Addresses voltage unbalance issues
Low power losses
Capable of generating a 415V three-phase output and interface a three-phase system to one battery. This provides cost advantages in that only one battery and battery management system per apparatus is needed.

This also results in a smaller unit as the higher modulation frequency made possible by using MOSFETS. Smaller size means smaller cabinets, saving both space and materials.

Being a four-quadrant device, enables it to be flexible to manage both active and reactive power. This makes it advantageous in managing battery energy storage systems, solar photovoltaic (PV) installations and distribution system voltages Reliable as the capacitors and other components are all high-quality components as no electrolytic capacitors are used.

The operation may be automatic based on the program in it, with little need for maintenance and servicing.

Throughout this specification and claims which follow, unless the context requires otherwise, the word "comprise", and variations such as "comprises" or "comprising", will be understood to imply the inclusion of a stated integer or group of integers or steps but not the exclusion of any other integer or group of integers. As used herein and unless otherwise stated, the term "approximately" means±20%.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

It will of course be realised that whilst the above has been given by way of an illustrative example of this invention, all such and other modifications and variations hereto, as would be apparent to persons skilled in the art, are deemed to fall within the broad scope and ambit of this invention as is herein set forth.

The invention claimed is:

1. An electrical power regulating apparatus configured to regulate electrical power in an electricity transmission network, including:
   a) a DC contactor having DC terminals configured to be connected to a DC device;
   b) a transmission network connector configured to be connected to the electricity transmission network and including:
      i) at least one live terminal configured to be connected to the electricity transmission network; and,
      ii) a neutral terminal configured to be connected to at least one of a neutral or earth of the electricity transmission network;
   c) a plurality of switches connected to the DC contactor;
   d) at least one live connection connected to the switches and a respective live terminal;
   e) a neutral connection connected to the switches and the neutral terminal;
   f) a one or more filters configured to suppress noise on the at least one connection; and,
   g) one or more electronic controlling devices coupled to the switches and being configured to control the switches to selectively connect the DC terminals and the at least one live connection and the neutral connection to thereby independently regulate electrical power on each of the at least one live connection and the neutral connection.

2. The electrical power regulating apparatus according to claim 1, wherein the one or more electronics controlling devices are configured to control the switches to operate in a current mode or a voltage mode.

3. The electrical power regulating apparatus according to claim 2, wherein, when in the current mode, the one or more electronics controlling devices are configured to control the switches so that each of the least one of the live terminals or the DC terminals have a predetermined current waveform.

4. The electrical power regulating apparatus according to claim 2, wherein, when in the voltage mode, the one or more electronics controlling devices are configured to control the switches so that each of the least one live terminals or the DC terminals have a predetermined voltage waveform.

5. The electrical power regulating apparatus according to claim 1, wherein the one or more electronics controlling devices are configured to control the switches to change between operating in a current mode and a voltage mode.

6. The electrical power regulating apparatus according to claim 1, wherein the apparatus further includes a snubber circuit connected between the one or more filters and the DC contactor for suppressing noise.

7. The electrical power regulating apparatus according to claim 1, wherein the neutral connection is decoupled from an earth.

8. The electrical power regulating apparatus according to claim 1, wherein the switches include a plurality of silicon carbide MOSFET switches.

9. The electrical power regulating apparatus according to claim 1, wherein the switches include a plurality of symmetrical half-bridge topology arms connecting to the at least one live connection and the neutral connection.

10. The electrical power regulating apparatus according to claim 1, wherein the one or more filters include at least one of:
　a) an electromagnetic interference (EMI) choke;
　b) a differential-mode choke connected to the at least one live connection and the neutral connection for filtering noise; and,
　c) a common-mode choke connected to the switches for suppressing interference.

11. The electrical power regulating apparatus according to claim 1, wherein the switches have a plurality of capacitors configured to at least one of:
　a) smooth fluctuations in DC power; and,
　b) store enough energy to complete each switching cycle with a full-phase offset range.

12. The electrical power regulating apparatus according to claim 11, wherein the capacitors are connected through an interleaving structure with a multi-layer printed circuit board (PCB).

13. The electrical power regulating apparatus according to claim 12, wherein the interleaving structure includes one or more through-holes connecting a positive contact of one of the capacitors to one or more positive layers of the PCB and a negative contact of one of the capacitor to one or more negative layers of the PCB.

14. The electrical power regulating apparatus according to claim 12, wherein the multi-layer PCB at least one of:
　a) defines alternating polarity layers to cancel generated magnetic fields;
　b) includes eight electrically conductive layers; and
　c) has at least two outer electrically conductive negative layers.

15. The electrical power regulating apparatus according to claim 1, wherein the plurality of capacitors are connected to a failsafe mechanism to discharge the capacitors in the event of a fault.

16. The electrical power regulating apparatus according to claim 15, wherein the failsafe mechanism includes at least one of:
　a) a hardware failsafe mechanism being configured to disconnect the DC contactor or the transmission network connector in the event of a fault; and,
　b) a software failsafe mechanism, in the event of a fault, being configured to at least one of:
　　i) rapidly connect and disconnect the capacitors to earth; and,
　　ii) turn off the DC contactor or the transmission network connector.

17. The electrical power regulating apparatus according to claim 1, wherein at least one of:
　a) the one or more electronic controlling devices include a master controller and a slave controller;
　b) the DC device includes at least one of:
　　i) a battery;
　　ii) a solar power generator;
　　iii) a hydrokinetic power generator; and,
　　iv) a wind power generator; and,
　c) the transmission network connector includes at least one of:
　　i) an AC contactor;
　　ii) an AC relay; and,
　　iii) an AC circuit breaker for each of the at least one live terminal.

18. The electrical power regulating apparatus according to claim 1, wherein the apparatus further includes a load connector configured to be connected to a load and including:
　i) at least one load terminal configured to be connected to the load; and,
　ii) a load neutral terminal configured to be connected to at least one of a neutral or earth of the load.

19. The electrical power regulating apparatus according to claim 18, wherein the load connector includes a DC circuit breaker for each of the at least one load terminal.

20. The electrical power regulating apparatus according to claim 1, wherein the apparatus further includes a communication interface connected to the one or more electronic controlling devices for communicating with an external device.

\* \* \* \* \*